(12) United States Patent
Chuang

(10) Patent No.: US 6,180,515 B1
(45) Date of Patent: Jan. 30, 2001

(54) METHOD OF FABRICATING SELF-ALIGN CONTACT WINDOW WITH SILICON NITRIDE SIDE WALL

(75) Inventor: Andy Chuang, Taipei (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/090,726

(22) Filed: Jun. 4, 1998

Related U.S. Application Data

(62) Division of application No. 08/954,410, filed on Oct. 20, 1997.

(51) Int. Cl.[7] ............................................. H01L 21/4763
(52) U.S. Cl. .................. 438/637; 438/296; 438/305; 438/306; 438/424; 438/437; 438/685
(58) Field of Search ............................ 438/296, 305, 438/306, 424, 437; 458/685, 637

(56) References Cited

U.S. PATENT DOCUMENTS 5,591,672 * 1/1997 Lee et al. .............................. 438/685
5,950,090 * 11/1998 Chen et al. ........................... 438/296

* cited by examiner

*Primary Examiner*—David Nelms
*Assistant Examiner*—Renee' R. Berry
(74) *Attorney, Agent, or Firm*—Merchant & Gould P.C.

(57) ABSTRACT

A gate oxide layer, a polysilicon layer are patterned on a substrate. Then, a thermal oxidation is carried out to form the first silicon dioxide layer on the surface of the polysilicon layer. Then, a first silicon nitride layer is patterned on the first silicon dioxide layer, over the top of the polysilicon layer. Then, a second silicon nitride layer is formed on the first silicon dioxide layer and the first silicon nitride layer. Next, a second silicon dioxide layer is formed on the second silicon nitride layer. Then, an etching technique is used to form the side-wall spacers. The side-wall spacers composed of silicon nitride layer and silicon dioxide layer. A dielectric layer is formed on the cap layer, side-wall spacers and silicon dioxide layer. An etch with high selectivity is used to etch the dielectric layer to create a contact hole.

34 Claims, 9 Drawing Sheets

METHOD OF FABRICATING SELF-ALIGN CONTACT WINDOW WITH SILICON NITRIDE SIDE WALL

This application is a Divisional of application Ser. No. 08/954,410, filed Oct. 20, 1997, which application is incorporated herein by reference.

FIELD OF THE INVENTION

The present invention relates to a method of a fabricating a semiconductor device, in particular, to a method of fabricating a self-align contact window with silicon nitride side wall spacers. The present invention can be utilized in photolithography process and etching process to increase the accuracy of forming the contact window.

DESCRIPTION OF THE PRIOR ART

With the rapid development of integrated circuits technologies, there has been a trend to reduce the scale of a device. Thus, semiconductor technologies have increased the integrated circuit density on a chip. The semiconductor devices manufactured in and on the semiconductor substrate are very closely spaced. The alignment, lithography technologies are more important than ever due to the density of the packing density is continuously increased. Especially, the tolerance of self-align contact process is degrade, it is because that the contact window is reduced by scaling down the dimension of the features formed on a wafer.

The prior art meets a problem during the formation of self-align contact (SAC), as shown in FIG. 1. Polysilicon gate electrodes 3 are formed on a semiconductor substrate 1. A cap layer 5 is formed on the top surface of the gate electrodes 3. Typically, the cap layer 5 is comprised of silicon oxide and is used as an etching barrier. Side wall spacers 7 composed of silicon oxide are formed on the side walls of the gate electrode 3. Active regions 9, such as source and drain, are formed in the substrate 1 adjacent to the gate electrodes 3. Thick field oxide regions 11 are created for providing isolation between devices. A dielectric layer 13 composed of silicon oxide is formed on the gate electrode 3 for the purpose of isolating.

The field oxide regions 11 are formed on the semiconductor substrates 1. Then, a silicon dioxide layer and a polysilicon layer 3 are respectively formed on the field oxide 11 and the semiconductor substrates 1 to act as the gate structure. Successively, a silicon nitride layer is deposited on the polysilicon layer. Followed by patterning a photoresist on the silicon nitride layer, the polysilicon layer, and the silicon oxide layer, an etching process is used to etch the polysilicon layer and silicon oxide layer. After the etching process, the gate electrodes 3 are formed, as shown in FIG. 2.

Turning to FIG. 3, a silicon oxide layer 7 is deposited by using an atmosphere pressure chemical vapor deposition (APCVD) on the gate electrodes 3 and the cap layer 5. An isotropic etching is used to form sidewall spacers 7 of the gate electrodes 3, as shown in FIG. 4. Then, ion implantation is used to form source and drain 9. Next, a dielectric layer 13 is formed on the gate electrode 3, cap layer 5 and the side wall spacers 7 by using low pressure chemical vapor deposition (LPCVD). A photoresist 15, as shown in FIG. 5, is patterned on the dielectric layer 13a. Then, a dry etching is performed to etch the dielectric layer 13a for forming a contact window. The photoresist is then removed, as shown in FIG. 6.

Unfortunately, the gate electrode 3 is generally exposed during the dielectric layer 13 is etched to form the contact window. The exposed gate electrodes 3 may cause gate leakage problem, for example, the gate 3 contacts with a subsequent polysilicon layer which contacts with the source/drain. The issue was caused by the cap layers 5, spacers 7 are etched during above etching step to form the contact window.

SUMMARY OF THE INVENTION

It is an object of the present invention to provide a method for fabricating an integrated circuit having self align contact window and that can overcome the problem of photographic techniques.

It is an another object of the present invention to provide a method for fabricating self align contact window with silicon nitride side wall.

A gate oxide layer, a polysilicon layer are respectively deposited on a substrate. A first silicon nitride layer is then formed on the polysilicon layer to act as a cap layer. Then, the gate oxide, the polysilicon layer and the first silicon nitride layer are etched to form a gate structure using a first photoresist as an etching mask. Subsequently, a first silicon dioxide layer is formed on the surface of the gate structure. The first silicon nitride layer is used to reduce the stress between the polysilicon gate and a subsequent silicon nitride layer. A second silicon nitride layer is formed to on the first silicon dioxide layer. Next, a second silicon dioxide layer is formed on the second silicon nitride layer by using a chemical vapor deposition. Then, an etching technique is used to form the side-wall spacers. The side-wall spacers composed of silicon nitride layer and silicon dioxide layer are used as etching barriers to prevent the polysilicon gate from being exposed during the formation of a contact window using the etching step. A dielectric layer is formed on the cap layer, side-wall spacers and silicon dioxide layer. An etch with high selectivity is used to etch the dielectric layer to create a contact hole.

In the second embodiment, a gate oxide layer, a polysilicon layer are respectively deposited on a substrate. An etching step is performed to etch the gate oxide the polysilicon layer after the polysilicon layer is formed. Then, a thermal oxidation is carried out to form the first silicon dioxide layer on the surface of the polysilicon layer. Then, a first silicon nitride layer is patterned on the first silicon dioxide layer, over the top of the polysilicon layer. The thickness and the reaction temperature of the silicon dioxide layer are respectively 30–200 angstroms, 800–950 centigrade degrees. Then, a second silicon nitride layer is formed on the first silicon dioxide layer and the first silicon nitride layer. Next, a second silicon dioxide layer is formed on the second silicon nitride layer by using a chemical vapor deposition. Then, an etching technique is used to form the side-wall spacers. The side-wall spacers composed of silicon nitride layer and silicon dioxide layer are used as etching barriers to preventing the polysilicon gate from being exposed during the formation of a contact window using the etching step. A dielectric layer is formed on the cap layer, side-wall spacers and silicon dioxide layer. An etch with high selectivity is used to etch the dielectric layer to create a contact hole.

BRIEF DESCRIPTION OF THE DRAWINGS

FIGS. 1–7 and FIGS. 8C–12C are cross section views of a semiconductor wafer illustrating a third embodiment according to the present invention.

DESCRIPTION OF THE PREFERRED EMBODIMENT

Figure 1:
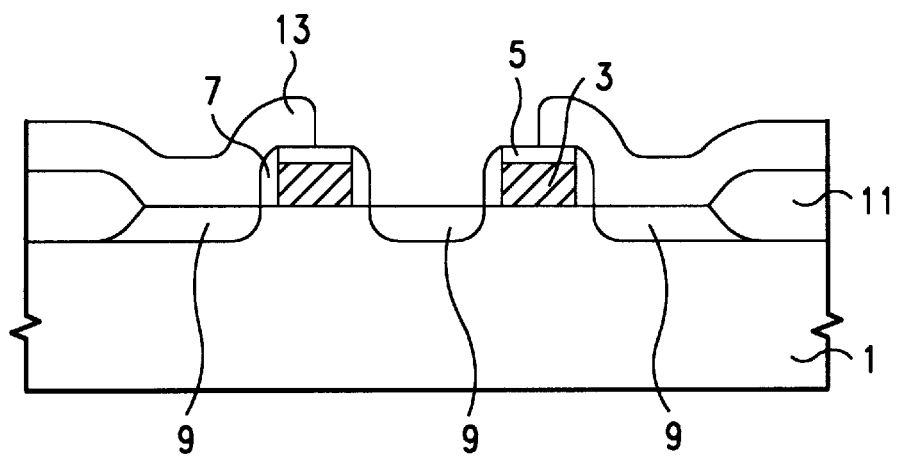
FIG. 1 is a cross section view of a semiconductor wafer illustrating a structure of the prior art.
Figure 2:
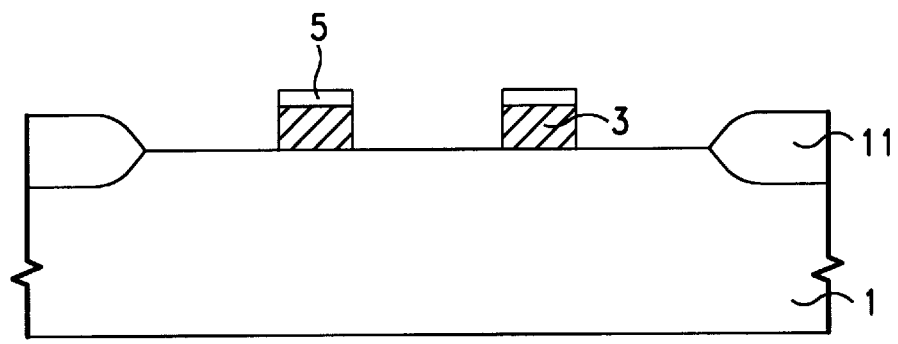
FIG. 2 is a cross section view of a semiconductor wafer illustrating the step of forming gate electrodes having cap layer according to the prior art.
Figure 3:
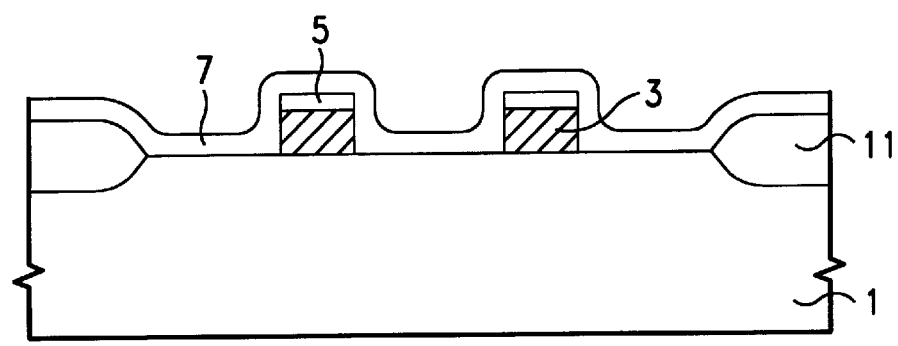
FIG. 3 is a cross section view of a semiconductor wafer illustrating the step of forming a silicon dioxide layer on the gate electrode according to the prior art.
Figure 4:
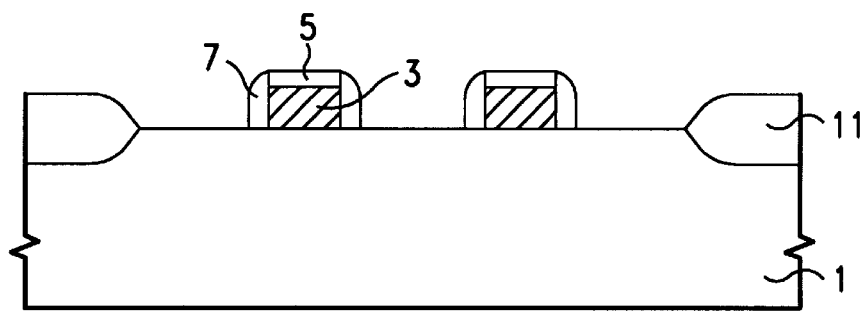
FIG. 4 is a cross section view of a semiconductor wafer illustrating the step of forming side-wall spacers of according to the prior art.
Figure 5:
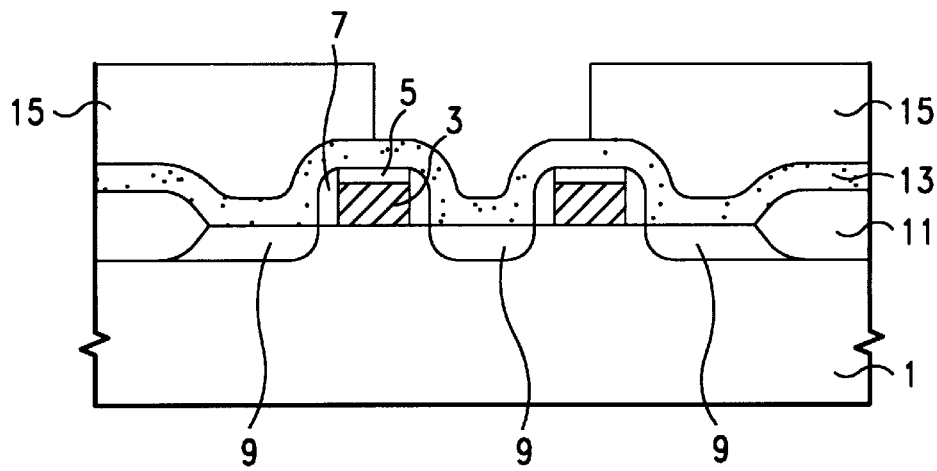
FIG. 5 is a cross section view of a semiconductor wafer illustrating the step of forming a dielectric layer on the substrate according to the prior art.
Figure 6:
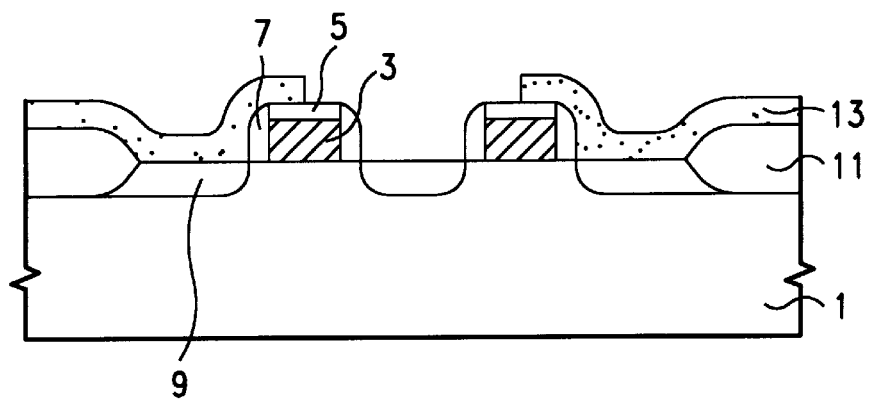
FIG. 6 is a cross section view of a semiconductor wafer illustrating the step of forming a contact window according to the prior art.
Figure 7:
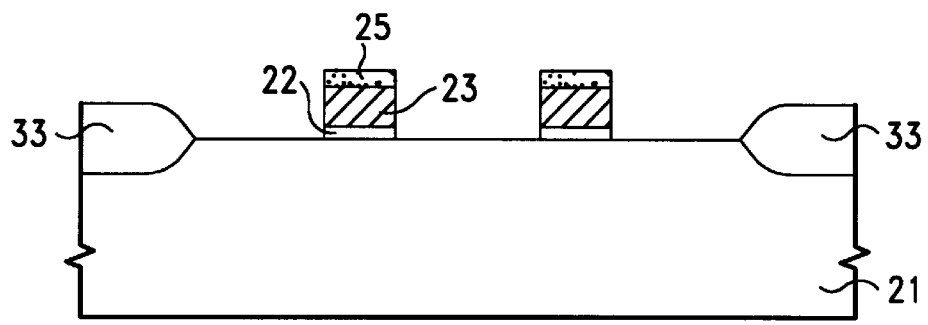
FIG. 7 is a cross section view of a semiconductor wafer illustrating the step of forming gate electrode according to the present invention.

The present invention will be described in detail with reference to the drawings. The present invention provides a method to fabricate a self-align contact window. Further, the present invention can be used to improve the accuracy of the contact window. Referring to FIG. 7, a single crystal substrate 21 is P-type with <100> crystallographic orientation. Isolation region, such as field oxide regions or trench isolation regions are formed on a semiconductor substrate for acting as isolations between devices. In the embodiment, field oxide regions 33 are used and formed by using a pad oxide and silicon nitride as an oxidation barrier on the substrate. The silicon substrate is then oxidized in an oxygen ambient to form the field oxide regions. The thickness of the field oxide region is about 4000–6000 angstroms. After that a conventional wet etch is used to remove the silicon nitride and the pad oxide. A gate oxide layer 22, a polysilicon layer 23 are respectively deposited on the substrate 21. Typically the polysilicon layer 23 is used as a gate of a MOS and formed by chemical vapor deposition to a thickness about 1000–2000 angstroms. A first silicon nitride layer 25 is then formed on the polysilicon layer to act as a cap layer. Then, the gate oxide, the polysilicon layer 23 and the first silicon nitride layer are etched to form a gate structure having a cap layer 25 using a first photoresist as an etching mask. The first silicon nitride layer 25 can be formed by LPCVD (low pressure chemical vapor deposition) process by reacting an excess of dichlorosilane with ammonia. The thickness of the first silicon nitride layer 25 is between a range about 300–800 angstroms.

Figure 8A:
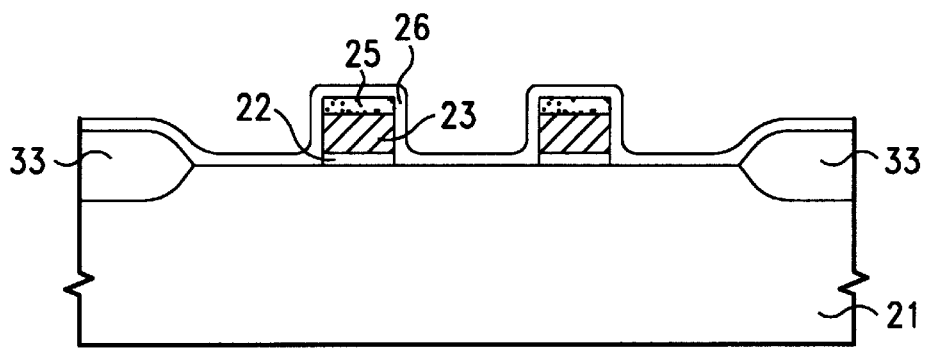
FIGS. 8A and 8B are cross section views of a semiconductor wafer illustrating the steps of forming a first silicon dioxide layer and a first silicon nitride layer on the gate electrode according to the present invention
Figure 8B:
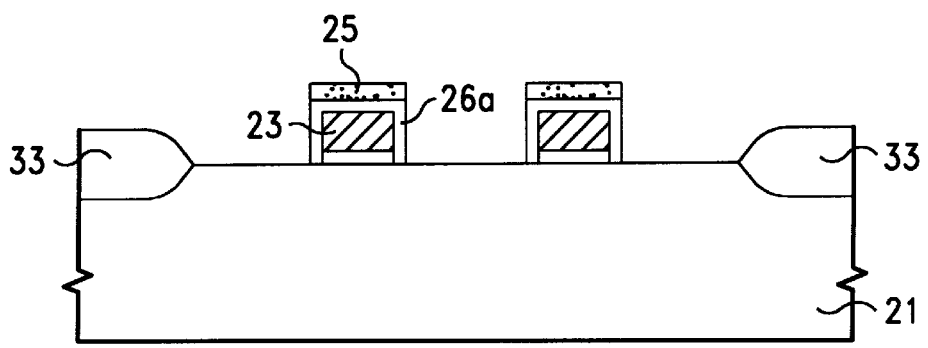
Figure 8C:
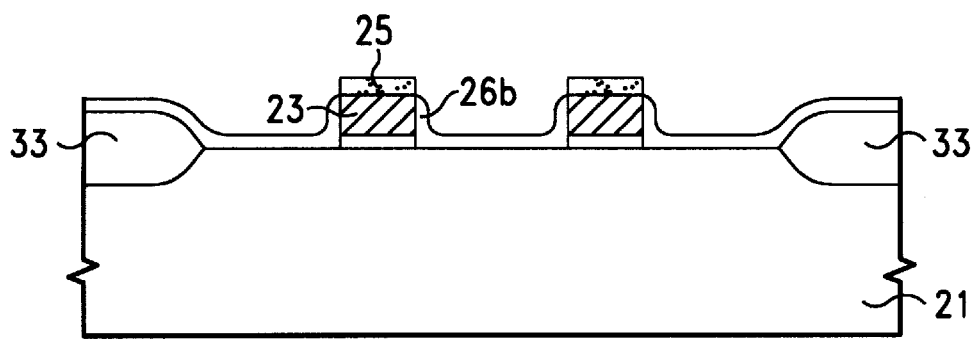

Subsequently, a first silicon dioxide layer 26 is formed on the surface of the gate structure that is consisted of the gate oxide 22, the polysilicon layer 23, and the silicon nitride layer 25, as shown in FIG. 8A. This step can be done by using chemical vapor deposition process, such as low pressure chemical vapor deposition at reaction temperature about 500–700 centigrade degrees. The thickness of the first silicon dioxide layer 26 is about 100–300 angstroms. Any suitable thickness can be used. The purpose of forming the first silicon dioxide layer 26 is to reduce the stress between the polysilicon gate and a subsequent silicon nitride layer. Alternatively, the layer to reduce the stress between the polysilicon gate and a subsequent silicon nitride layer can also be formed before the cap layer (first silicon nitride layer) 25 is formed. The second embodiment is described as follows. Turning to FIG. 8B, an etching step is performed to etch the gate oxide, 22 the polysilicon layer 23 after the polysilicon layer 23 is formed. Then, a thermal oxidation is carried out to form the first silicon dioxide layer 26a on the surface of the polysilicon layer 23. Then, a first silicon nitride layer 25 is patterned on the first silicon dioxide layer 26a, over the top of the polysilicon layer 23. The thickness and the reaction temperature of the silicon dioxide layer 26a are respectively 30–200 angstroms, 800–950 centigrade degrees.

Figure 9A:
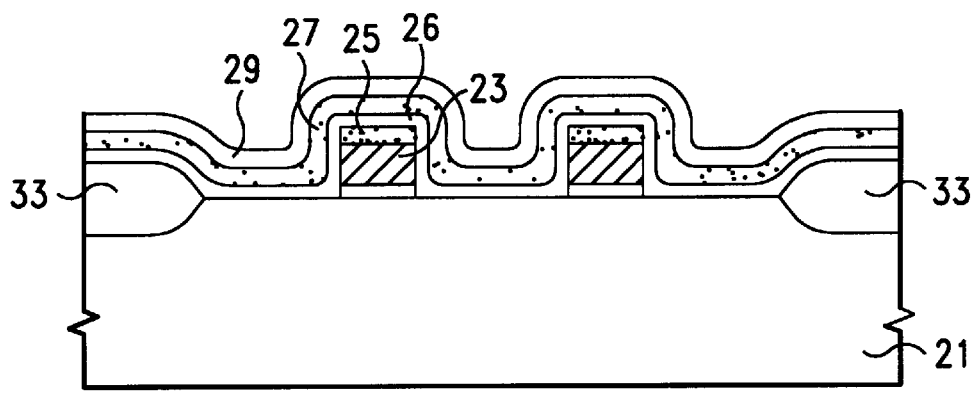
FIGS. 9A and 9B are cross section views of a semiconductor wafer illustrating the steps forming a second silicon dioxide layer and a second silicon nitride layer over the gate electrode according to the present invention.
Figure 9B:
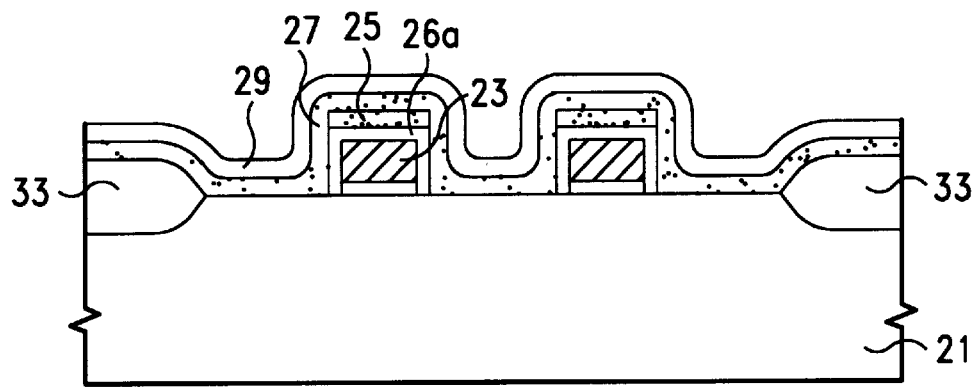
Figure 9C:
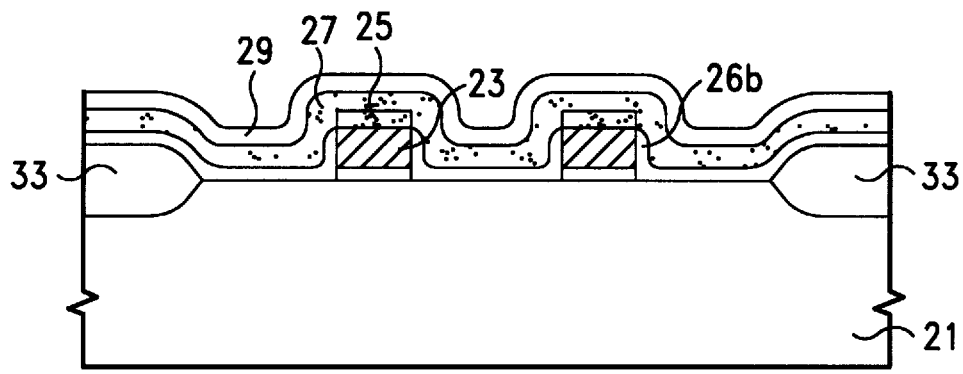
Figure 10A:
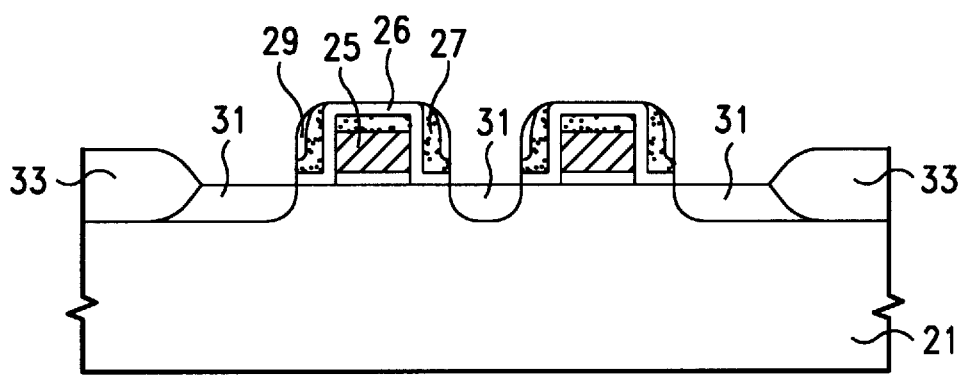
FIGS. 10A and 10B are cross section views of a semiconductor wafer illustrating the step forming a silicon dioxide layer, a silicon nitride layer side-walls spacers on the side wall of the gate electrode according to the present invention.
Figure 10B:
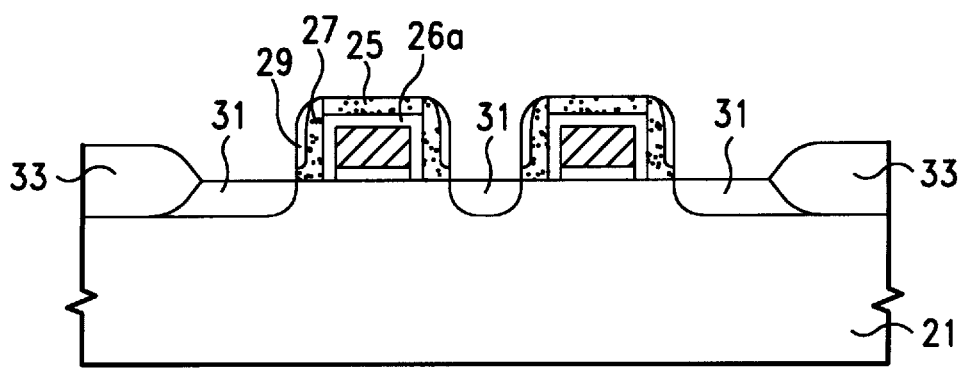
Figure 10C:
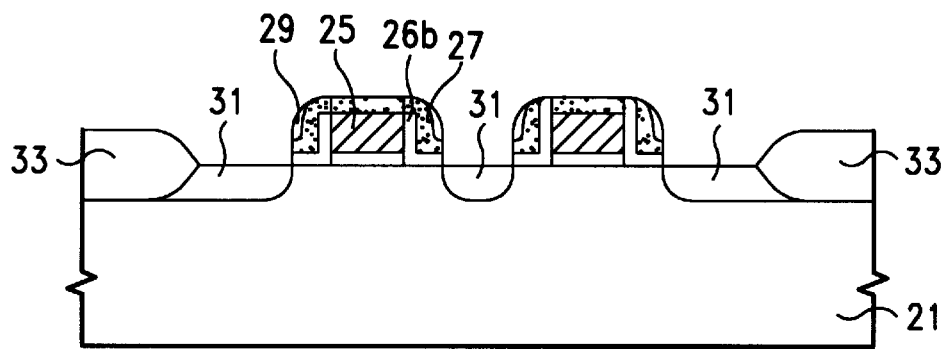

As shown in FIG. 9A, a PECVD (plasma enhance chemical vapor deposition) process is performed to deposit a second silicon nitride layer 27 to a thickness about 300–800 angstroms on the first silicon dioxide layer 26. In the second embodiment, the second silicon nitride layer 27 is formed on the first silicon dioxide layer 26 and the first silicon nitride layer 26a. The second silicon nitride layer 27 is also formed on the substrate 21, the field oxide 33, as shown in FIG. 9B. Next, a second silicon dioxide layer 29 is formed on the second silicon nitride layer 27 by using a CVD (chemical vapor deposition) process. Preferably, the thickness of the second silicon dioxide layer 29 is about at a range of 1000–2000 angstroms. The silicon nitride layer 27 and the silicon dioxide layer 29 are subsequently utilized to form spacers of the gate electrodes 23, as shown in FIG. 10A and FIG. 10B.

As well known in the art, side-wall spacers can be achieved by using anisotripical etching step. Thus, an etching technique is used to form the side-wall spacers which are composed of silicon nitride layer 27 and silicon dioxide layer 29. The reactive gases of the process are $CHF_3$, $CF_4$, $SF_6$ and $N_2$. The side-wall spacers composed of silicon nitride layer 27 and silicon dioxide layer 29 are used as etching barriers to preventing the polysilicon gate from being exposed during the formation of a contact window using the etching step. In addition, the source and drain 31 of the device can be formed by ion implantation after the sapcers 27, 29 are formed. The formation of source and drain regions are well known in the art, which will not be given with a detail description herein.

Figure 11A:
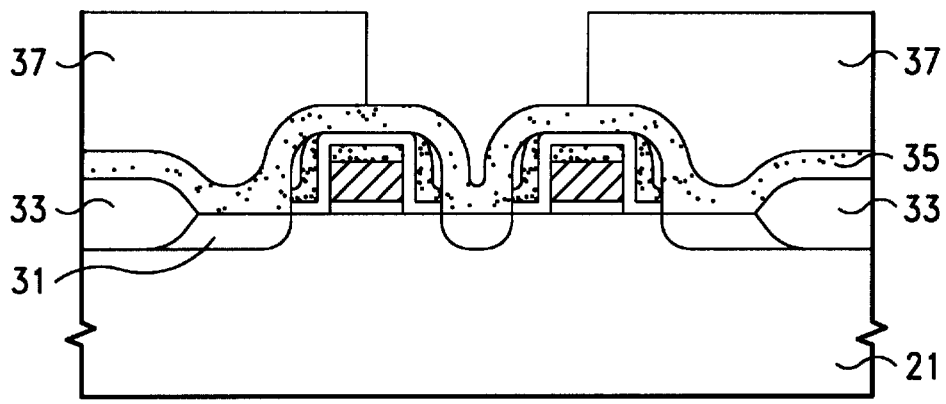
FIGS. 11A and 11B are cross section views of a semiconductor wafer illustrating the step forming a dielectric layer and on the substrate according to the present invention.
Figure 11B:
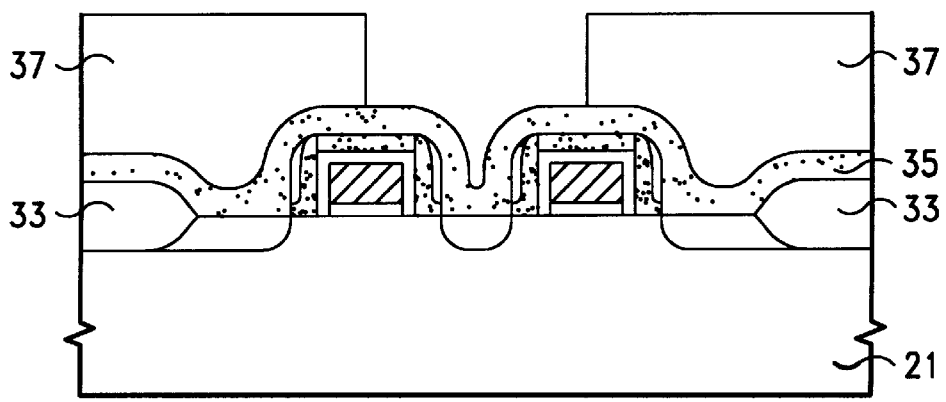
Figure 11C:
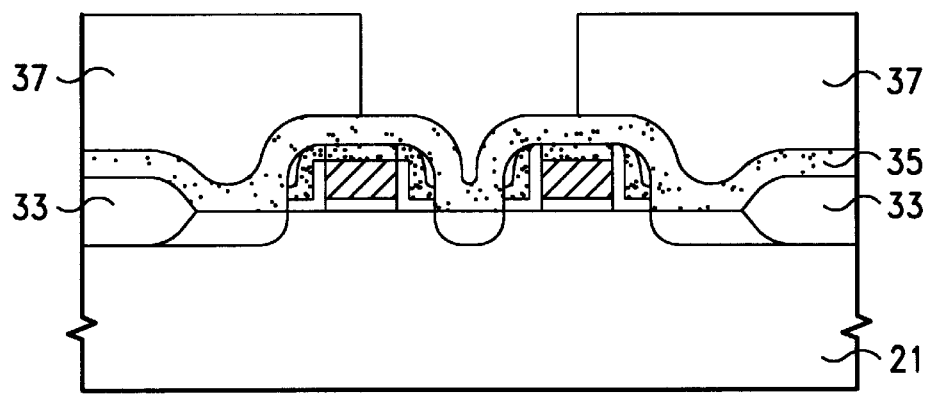
Figure 12A:
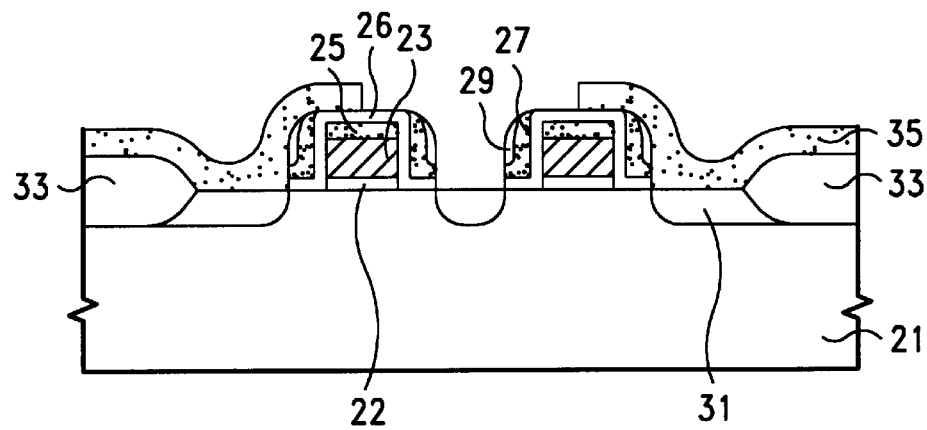
FIGS. 12A and 12B are cross section views of a semiconductor wafer illustrating the step forming a contact window according to the present invention.
Figure 12B:
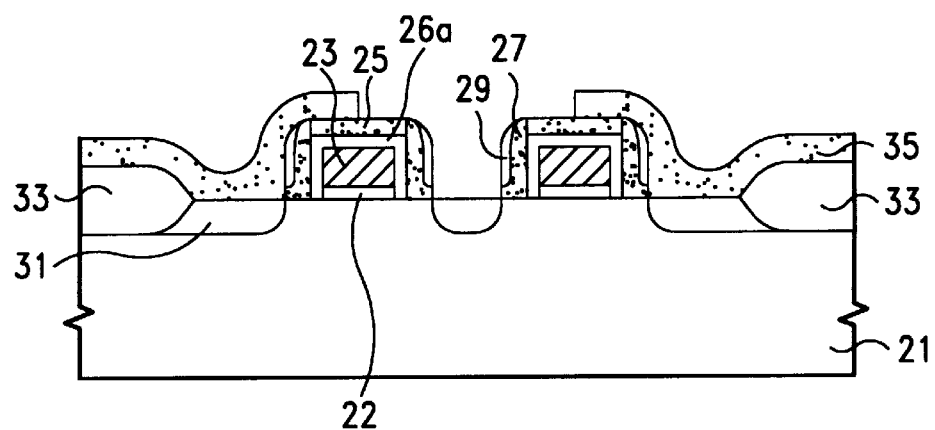
Figure 12C:
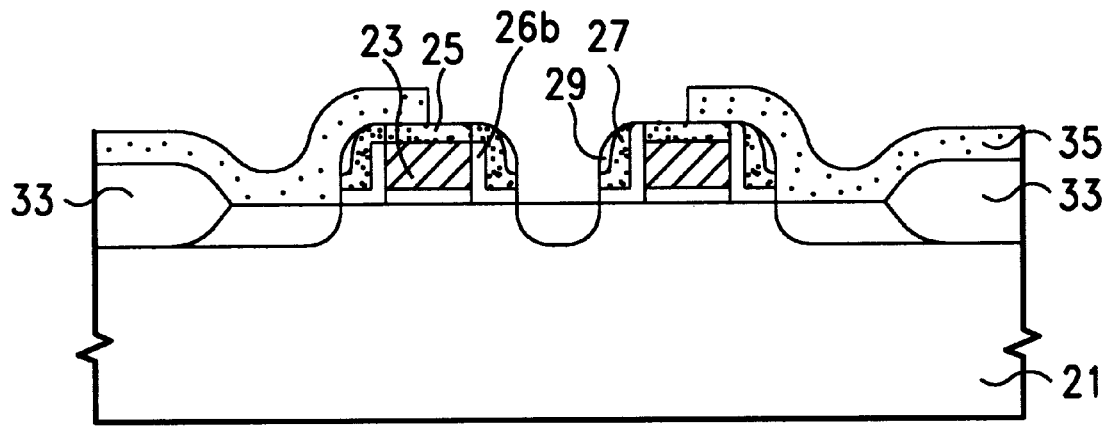
Figure 13A:
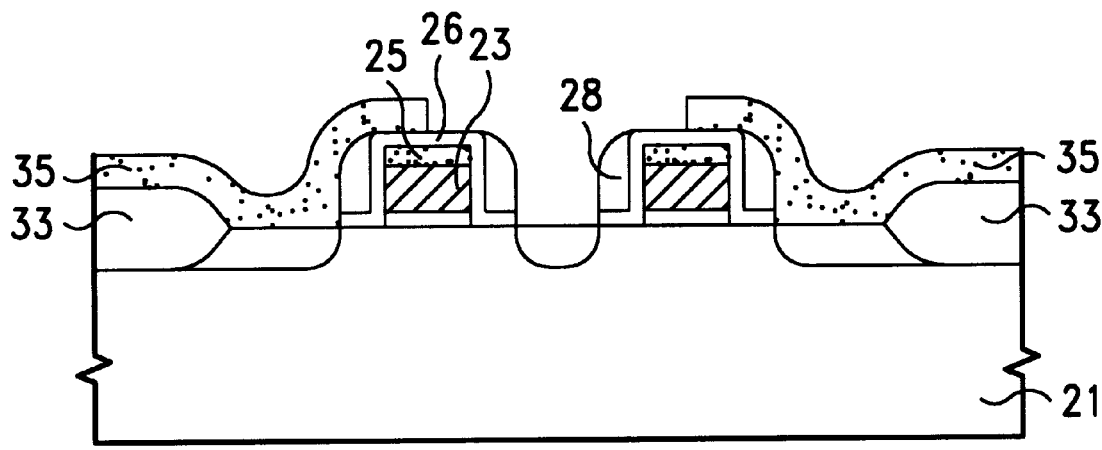
FIGS. 13A–13C are cross section views of a semiconductor wafer illustrating only one layer of side-wall spacers instead of two layers of side-wall spacers according to the present invention.
Figure 13B:
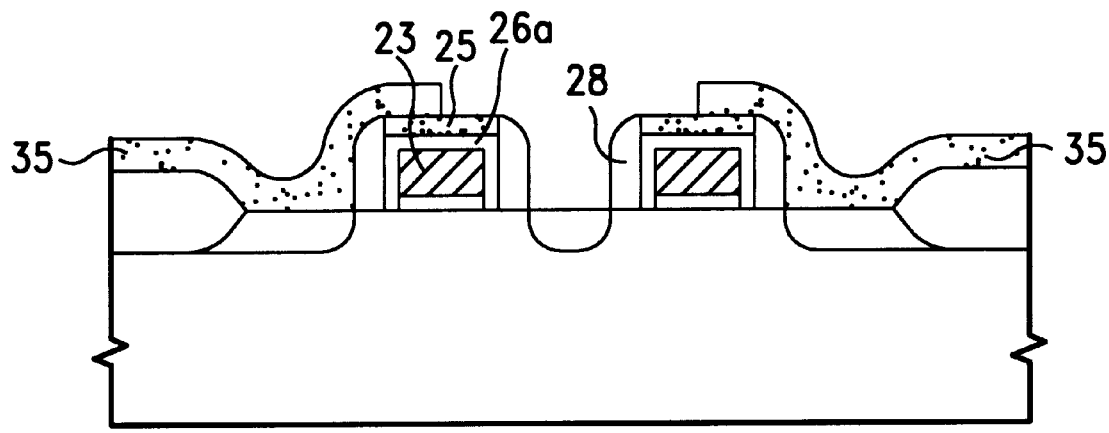
Figure 13C:
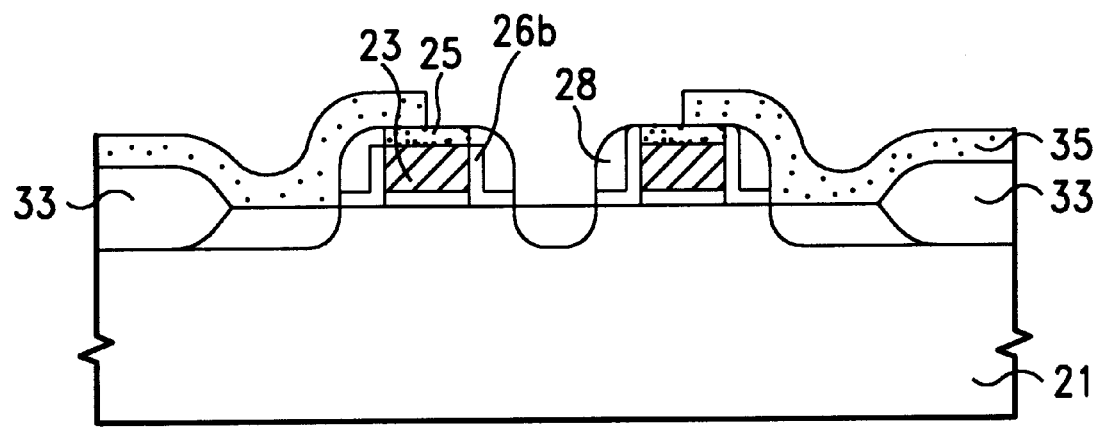

Please see FIG. 11A and FIG. 11B, a dielectric layer 35 is formed on the cap layer, 25, side-wall spacers 27, 29 and silicon dioxide layer 26 to a thickness about 1500–3000 angstroms. The dielectric layer 35 can be composed of silicon dioxide, BPSG or silicon nitride. Then, a photoresist 37 is patterned on the dielectric layer 35 to define the contact window area. The photoresist 37 has an opening 37a that is aligned to the source or drain. A portion of the cap layer 25 or the first silicon nitride layer 26 is exposed by the opening 37a. An etch with high selectivity is used to etch the dielectric layer 35. The dielectric layer 35 serves as an isolation layer for isolating the substrate 21 and the subsequent overlying layers that are used as interconnections or the like. The reaction gas of the highly selective etching between the layer 35 and the silicon nitride side-wall spacers 27 are CO, $C_4F_8$, and $CF_4$. Argon can be used as the ion source of the highly selective etching. The etching rate of the silicon dioxide is faster than silicon nitride by using the etchant. The silicon nitride side-wall spacers 27 and silicon nitride cap layers 25 serves as etching barriers to form the contact window. Therefore, the highly selective etching process improves the accuracy of the contact window, shown as the FIG. 12A FIG. and 12B. The portion of the first silicon dioxide layer 26 is also removed during the etching process.

In the figures, the gate oxide 22 is on the substrate 21 and polysilicon gate 23 is formed on the gate oxide 22. A cap layer 25 is formed on the top of the gate 23. An oxide layer 26 is formed along the surface of the polysilicon gate 23 and the cap layer 25. Silicon nitride side wall spacers 27 are formed on the side walls of the gate, cap layer 23, 25, and on the oxide layer 26. Silicon dioxide side wall spacers 29 are formed on the side walls of the silicon nitride side wall spacers 27. A dielectric layer 35 is formed on the substrate 21, covers a first portion of the gate, and exposes a second portion of the gate. A portion of the substrate 21 is exposed by the gate structure and the dielectric layer 35. Another embodiment includes the gate oxide 22 is formed on the substrate 21. The polysilicon gate 23 is formed on the gate oxide 22. An oxide layer 26a is formed along the surface of the polysilicon gate. A cap layer 25 is formed over the top of the gate 23 and on the oxide layer 26a. Siliocn nitride side wall spacers 27 are formed on the side walls of the gate structure 23, 25, and on the oxide layer 26a. Silicon dioxide side wall spacers 29 are formed on the side walls of the siliocn nitride side wall spacers 27. A dielectric layer 35 is formed on the substrate 21, covers a first portion of the gate, and exposes a second portion of the gate. A portion of the substrate 21 is exposed by the gate structure and the dielectric layer 35.

The present invention provides a novel method of forming a self-align contact window which has many advantages over the prior art. First, the silicon nitride side-wall spacers 27 permits a small contact hole thus miniaturizing the cell beyond lithographic limits. The side-wall spacers 27 composed of silicon nitride serve as etching barrier to prevent the polysilicon gate from being exposed. Furthermore, the cap layers 25 on the gate electrode 23 contributes to the smooth topology of resultant surface that provides a smoother surface for subsequent overlying layers.

In a third embodiment of the present invention, after the gate structure 22, 23 having cap layer 25 are patterned, a thermal oxide layer 26b is formed on the side walls of the polysilicon gates 23 and gate oxides 22. Then, a second silicon nitride layer 27 and a silicon dioxide layer 29 are respectively formed over the gate structure 22, 23, the cap layer 25 and the thermal oxide layer 26b. Other processes and steps are the same with the aforesaid embodiments, thus only a curcory description is given herein.

As well known in the art, the polysilicon gate 23 can include a metal siliside formed thereon to increase the conductivity of the gate 23. Further, the present invention can use only one layer of side-wall spacers 28 instead of two layers of side-wall spacers 27, 29. The side-wall spacer can be composed of silicon dioxide or silicon nitride.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of fabricating a self-align contact window for use in integrated circuits, said method comprising the steps of:

forming a gate oxide layer on a semiconductor substrate;

forming a polysilicon layer on said gate oxide layer;

forming a first silicon nitride layer on said polysilicon layer, said first silicon nitride layer being used to form a cap layer;

patterning said first silicon nitride layer, said polysilicon layer and said gate oxide layer to form a gate structure having a cap layer;

forming a first silicon dioxide layer on a surface of said polysilicon layer and on a surface of said first silicon nitride layer using chemical vapor deposition;

forming a second silicon nitride layer on said first silicon dioxide layer;

etching said second silicon nitride layer to form first side wall spacers on the side walls of said first silicon dioxide layer; wherein said first silicon dioxide layer is used to reduce stress between said polysilicon layer and said first side wall spacers;

forming a dielectric layer on said first side wall spacers, said first silicon dioxide layer and said substrate to serve as an isolation region; and patterning said dielectric layer to form a contact window in said dielectric layer and exposing a portion of said substrate.

2. The method of claim 1, further comprising:

forming a second silicon dioxide layer on said second silicon nitride layer after forming said second silicon nitride layer; and etching said second silicon dioxide layer before etching said second silicon nitride layer to form a second side wall spacers on side walls of said first side wall spacers.

3. The method of claim 1, wherein said first side-wall spacers are formed by following steps:

forming a third silicon dioxide layer on said first silicon dioxide layer as an etching barrier; and etching said third silicon dioxide layer.

4. The method of claim 1, wherein a reaction gas of said etching to form said first side-wall spacers are composed of $CHF_3$, $CF_4$, $SF_6$ and $N_2$.

5. The method of claim 2, wherein a reaction gas of said etching to form said first side-wall spacers are composed of $CHF_3$, $CF_4$, $SF_6$ and $N_2$.

6. The method of claim 1, wherein an ion source of forming said contact window is argon, and a reaction gas of forming said contact window are composed of CO, $C_4F_8$, and $CF_4$.

7. The method of claim 1, wherein said polysilicon layer includes metal silicide formed thereon.

8. A method of fabricating a self-align contact window for used in integrated circuits, said method comprising the steps of:

forming a gate oxide layer on a semiconductor substrate;
forming a polysilicon layer on said gate oxide layer;
patterning said polysilicon layer and said gate oxide layer to form a gate structure;
forming a first silicon dioxide layer on a surface of said polysilicon layer using a thermal oxidation process;
patterning a first silicon nitride layer on said first silicon dioxide layer and over said gate structure to act as a cap layer;
forming a first side-wall spacers on side walls of said structure;
forming a dielectric layer on said side-wall spacers, said gate structure and said substrate to serve as an isolation layer; and
patterning said dielectric layer to form a contact window in said dielectric layer and exposing a portion of said substrate.

9. The method of claim 8, wherein said first side-wall spacers are formed by following steps:
forming a second silicon nitride layer on said first silicon dioxide layer, said pad layer as an etching barrier, wherein said first silicon dioxide layer is used to reduce a stress between said polysilicon layer and said first side-wall spacers; and
etching said second silicon nitride layer.

10. The method of claim 9, further comprising:
forming a second silicon dioxide layer on said second silicon nitride layer after forming said second silicon nitride layer; and
etching said second silicon dioxide layer before etching said second silicon nitride layer to form a second side-wall spacers on side walls of said first side-wall spacers.

11. The method of claim 8, wherein said first side-wall spacers are formed by following steps:
forming a third silicon dioxide layer on said first silicon dioxide layer and said cap layer as an etching barrier; and
etching said third silicon dioxide layer.

12. The method of claim 8, wherein a reaction gas of said etching to form said side-wall spacers are composed of $CHF_3$, $CF_4$, $SF_6$ and $N_2$.

13. The method of claim 10, wherein a reaction gas of said etching to form said side-wall spacers are composed of $CHF_3$, $CF_4$, $SF_6$ and $N_2$.

14. The method of claim 8, wherein an ion source of forming said contact window is argon, and a reaction gas of forming said contact window are composed of CO, $C_4F_8$, and $CF_4$.

15. The method of claim 8, wherein said polysilicon layer includes metal silicide formed thereon.

16. A method of fabricating a self-align contact window for used in integrated circuits, said method comprising the steps of:
forming a gate oxide layer on a semiconductor substrate;
forming a polysilicon layer on said gate oxide layer;
forming a first silicon nitride layer on said polysilicon layer as a cap layer;
patterning said first silicon nitride layer, polysilicon layer and said gate oxide layer to form a gate structure;
forming a first silicon dioxide layer on a surface of said gate structure by using a thermal oxidation process;
forming a first side-wall spacers on side walls of said gate structure;
forming a dielectric layer on said side-wall spacers, said gate structure and said substrate to serve as an isolation layer; and
patterning said dielectric layer to form a contact window in said dielectric layer and exposing a portion of said substrate.

17. The method of claim 16, wherein said first side-wall spacers are formed by following steps:
forming a second silicon nitride layer on said first silicon dioxide layer, said pad layer as an etching barrier, wherein said first silicon dioxide layer is used to reduce a stress between said polysilicon layer and said first side-wall spacers; and
etching said second silicon nitride layer.

18. The method of claim 17, further comprising:
forming a second silicon dioxide layer on said second silicon nitride layer after forming said second silicon nitride layer; and
etching said second silicon dioxide layer before etching said second silicon nitride layer to form a second side-wall spacers on side walls of said first side-wall spacers.

19. The method of claim 16, wherein said first side-wall spacers are formed by following steps:
forming a third silicon dioxide layer on said first silicon dioxide layer and said cap layer as an etching barrier; and
etching said third silicon dioxide layer.

20. The method of claim 16, wherein a reaction gas of said etching to form said side-wall spacers are composed of $CHF_3$, $CF_4$, $SF_6$ and $N_2$.

21. The method of claim 18, wherein a reaction gas of said etching to form said side-wall spacers are composed of $CHF_3$, $CF_4$, $SF_6$ and $N_2$.

22. The method of claim 16, wherein an ion source of forming said contact window is argon, and a reaction gas of forming said contact window are composed of CO, $C_4F_8$, and $CF_4$.

23. The method of claim 16, wherein said polysilicon layer includes metal silicide formed thereon.

24. The method of claim 1, wherein said first side-wall spacers are made of silicon nitride.

25. The method of claim 1, wherein said chemical vapor deposition process is a low pressure chemical vapor deposition process.

26. The method of claim 1, wherein said first silicon dioxide layer is formed at about 500–700 centigrade degrees.

27. The method of claim 1, wherein said first silicon dioxide layer has a thickness of about 100–300 angstroms.

28. The method of claim 1, wherein said first silicon dioxide layer is a substantially conformal silicon dioxide layer.

29. The method of claim 8, wherein said first side-wall spacers are made of silicon nitride.

30. The method of claim 8, wherein said first silicon dioxide layer has a thickness of about 30–200 angstroms.

31. The method of claim 8, wherein said first silicon dioxide layer is formed at about 800–950 centigrade degrees.

32. The method of claim 8, wherein said first silicon dioxide layer is a substantially conformal silicon dioxide layer.

33. The method of claim 16, wherein said first side-wall spacers are made of silicon nitride.

34. The method of claim 16, wherein said first silicon dioxide layer is a substantially conformal silicon dioxide layer.

* * * * *